United States Patent [19]

Hoffmann

[11] Patent Number: 4,549,096
[45] Date of Patent: Oct. 22, 1985

[54] MONOLITHICALLY INTEGRATED SEMICONDUCTOR CIRCUIT WITH TRANSISTORS

[75] Inventor: Kurt Hoffmann, Taufkirchen, Fed. Rep. of Germany

[73] Assignee: Siemens Aktiengesellschaft, Berlin and Munich, Fed. Rep. of Germany

[21] Appl. No.: 533,615

[22] Filed: Sep. 19, 1983

Related U.S. Application Data

[63] Continuation of Ser. No. 227,505, Jan. 22, 1981.

[30] Foreign Application Priority Data

Jan. 28, 1980 [DE] Fed. Rep. of Germany ....... 3002894

[51] Int. Cl.$^4$ .............................................. H03F 3/42
[52] U.S. Cl. .................................... 307/297; 307/304
[58] Field of Search ................... 307/296 R, 297, 304, 307/448; 323/312–314

[56] References Cited

U.S. PATENT DOCUMENTS

| | | | |
|---|---|---|---|
| 3,546,493 | 12/1970 | Kauppila | 307/304 |
| 3,634,751 | 1/1972 | Miller | 323/313 |
| 3,806,741 | 4/1974 | Smith | 307/304 |
| 4,004,164 | 1/1977 | Cranford, Jr. et al. | 307/362 X |
| 4,135,125 | 1/1979 | Oura | 307/297 X |
| 4,152,716 | 5/1979 | Torii et al. | 307/296 R X |
| 4,208,595 | 6/1980 | Gladstein et al. | 307/297 |
| 4,233,672 | 11/1980 | Suzuki et al. | 307/DIG. 1 X |
| 4,256,974 | 3/1981 | Padgett et al. | 307/475 |
| 4,260,909 | 4/1981 | Dumbri et al. | 307/297 |
| 4,260,946 | 4/1981 | Wheatley, Jr. | 307/297 X |
| 4,291,242 | 9/1981 | Schriber | 307/475 X |
| 4,300,061 | 11/1981 | Mihalich et al. | 307/297 |

OTHER PUBLICATIONS

Sonoda, "Substrate Voltage Shift Circuit"; *IBM Tech. Discl. Bull.;* vol. 18, No. 3, pp. 705; 8/1975.
Mead & Conway, *Introduction to VLSI Systems,* Addison-Wesley Pub. Co., Reading, Mass., 1980, pp. 5–8, 11–12, 233–236.
Millman & Halkias, *Integrated Electronics: Analog and Digital Circuits and Systems,* McGraw-Hill Book Co., New York, N.Y., 1972, pp. 447–483.

*Primary Examiner*—Stanley D. Miller
*Assistant Examiner*—D. R. Hudspeth
*Attorney, Agent, or Firm*—Herbert L. Lerner; Laurence A. Greenberg

[57] ABSTRACT

Monolithically integrated semiconductor circuit with transistors, the semiconductor circuit proper having elements thereof formed on the front side of a semiconductor chip, the latter also having at the surface thereof two supply terminals actable upon by a respective supply potential and connected, on the one hand, to the elements of the semiconductor circuit proper and, on the other hand, to an additional circuit part for generating a substrate bias applied to a substrate region occupying the rear side of the semiconductor chip and, respectively, to at least one semiconductor zone belonging to the semiconductor circuit proper and to a gate electrode on the front side of the semiconductor chip which controls the semiconductor zone and is insulated therefrom, including a series connection of the substrate bias generator and the semiconductor circuit proper dividing a voltage present at the two supply terminals of the semiconductor chip in a manner that a reference potential required for the semiconductor circuit proper is produced.

6 Claims, 8 Drawing Figures 4,549,096

MONOLITHICALLY INTEGRATED SEMICONDUCTOR CIRCUIT WITH TRANSISTORS

This application is a continuation of application Ser. No. 227,505, filed Jan. 22, 1981.

The invention relates to a monolithically integrated semiconductor circuit with transistors, especially MOS field-effect transistors, the semiconductor circuit proper having elements thereof formed on the front side of a semiconductor chip formed especially of monocrystalline silicon, wherein two supply leads, which are actable upon by a respective supply potential, are further provided at the surface of the semiconductor chip and are connected, on the one hand, to the elements of the semiconductor circuit proper and, on the other hand, to an additional circuit part by means of which a substrate bias is generated which is applied to a substrate region occupying the rear side of the semiconductor chip and, respectively, to at least one semiconductor zone belonging to the semiconductor circuit proper and to a gate electrode on the front side of the semiconductor chip which controls the semiconductor zone and is insulated therefrom.

Circuits of this type are generally known and are used mainly in digital semiconductor circuits, for example, in semiconductor memories. An example of such a circuit is provided in "1979 IEEE International Solid-State Circuits Conference, pages 142 and 143.

In the manufacture of monolithically integrated semiconductor circuits, the following aspect is generally of importance, namely, the trend toward lower supply voltages. Thus, a common source potential $V_{SS}$, which is usually also the reference potential, and a drain potential $V_{CC}$ of +5 V relative to the reference potential $V_{SS}$ are needed in a monolithically integrated semiconductor circuit produced with n-channel MOS technology. In addition, a substrate bias $V_{BB}$ of −5 V relative to the reference potential is required for the rear side of the semiconductor chip. The required potentials are shown in detail in FIG. 1, and are required in the integrated semiconductor circuit IS.

It is an object of the invention to provide a possibility, whereby the supply voltage to be applied to the two supply leads of the semiconductor chip can be reduced to the conditions shown in FIG. 2, as compared to the values shown in FIG. 1, namely of about 10 V. The letters A and B shown in parentheses in FIGS. 1 and 2 identify the two supply terminals of the semiconductor chip representing the integrated circuit IS.

With the foregoing and other objects in view, there is provided in accordance with the invention, means for solving this problem, namely by generating the $V_{SS}$ potential (reference potential) in the integrated circuit (IC). The voltage present at the two supply leads of the semiconductor chip is divided by the series connection of the substrate bias generator and the integrated circuit in such a manner that a $V_{SS}$ potential is produced on the IC.

Therefrom, the circuit principle shown in FIG. 3 is obtained: The two supply terminals A and B of the semiconductor chip H, which in most cases will be formed of monocrystalline silicon (possibly also monocrystalline CaAs), are bridged via the series connection of the integrated semiconductor circuit ES proper and an additional circuit part for generating the substrate bias. There is thus especially provided that no further connections exist between the two terminals A and B and the integrated semiconductor ES proper and the substrate bias generator, respectively.

Other features which are considered as characteristic for the invention are set forth in the appended claims.

Although the invention is illustrated and described herein as embodied in a monolithically integrated semiconductor circuit with transistors, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which.

Figure 5:
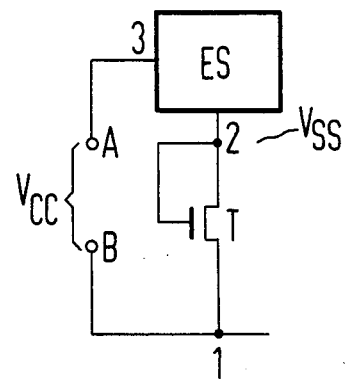
FIG. 5 is a circuit diagram of an especially simple embodiment of the invention.
Figure 7:
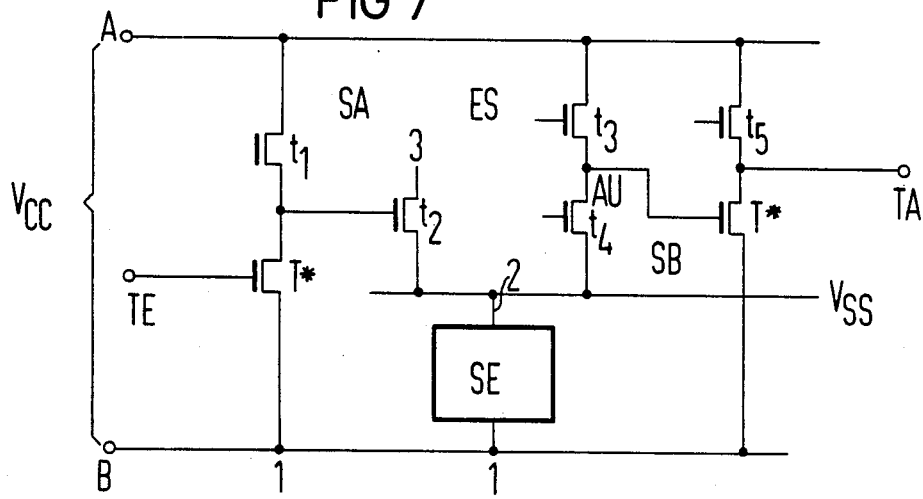
Figure 8:
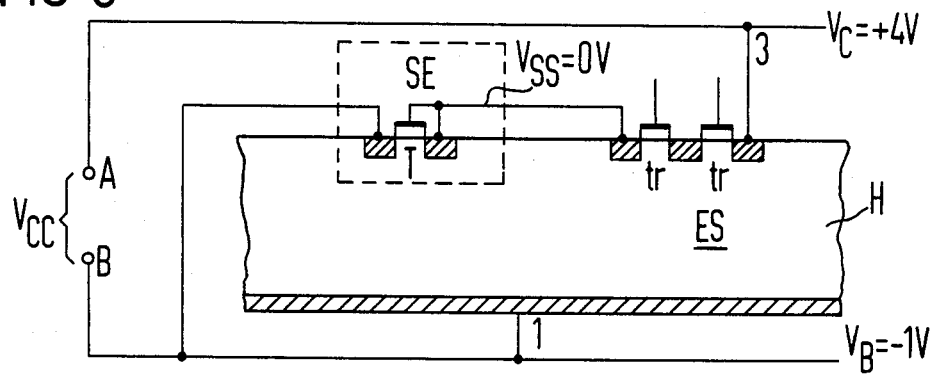

FIG. 7 is a circuit diagram of yet another embodiment of the invention having additional circuit parts which are required if the integrated circuit proper contains not only MOS field-effect transistors but also bipolar transistors i.e. if MOS-TTL combinations are involved; and FIG. 8 is a cross-sectional view partly schematic, of a physical embodiment of the semiconductor circuit shown wholly schematically in FIG. 5.

The various possibilities of the invention will now be described in detail with reference to FIGS. 4 to 8 of the drawings.

Figure 1:
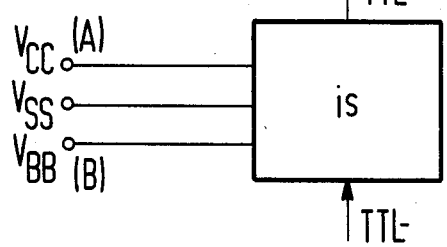
FIGS. 1 and 2 are block diagrams generally explanatory of the prior art.
Figure 2:
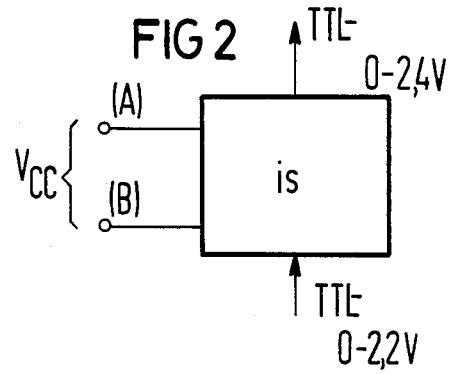
Figure 3:
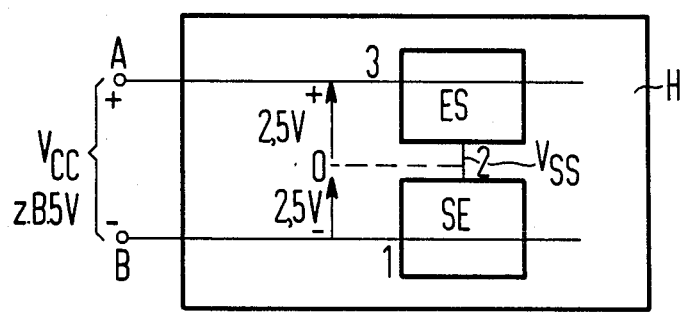
FIG. 3 is a block diagram generally illustrating the circuit principle according to the invention.
Figure 4:
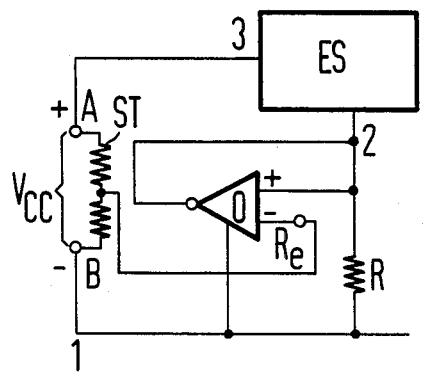
FIG. 4 is a basic circuit diagram for a substrate bias generator SE.

The basic circuit diagram for a substrate bias generator SE shown in FIG. 4 contains as an essential component, an operational amplifier O, having an inverting input which is connected, on the one hand, via a resistor R, to the supply terminal B which carries supply potential and, on the other hand, to the internal supply terminal 2 of the integrated semiconductor circuit ES, which carries the reference potential for the latter, such as $V_{SS}$, for example. Negative feed-back is further provided for the operational amplifier O by connecting the output thereof to the inverting input and, thereby, to the internal supply terminal circuit node 2 between the resistor R and the integrated circuit proper or, in other words, to the internal terminal 2 receiving reference potential.

The non-inverting input of the operational amplifier O is connected to a reference potential Re of OV which can be derived from the supply voltage $V_{CC}$ applied to the two supply terminals A, B, for example, by means of a voltage divider ST. Because the two, for example, equal-sized resistors forming the voltage divider ST can be of high resistance, the current loss can be made low, so that the voltage divider ST can also be integrated is required or desired.

The internal terminal 3 of the integrated semiconductor circuit ES proper which carries the second supply potential, is connected directly to the other supply terminal A of the semiconductor chip H. Whether the terminal A of the semiconductor chip H is to be connected to the positive or negative terminal of the d-c voltage source furnishing the supply potentials, depends upon the type of transistors used in the circuit. If the transistors are formed as MOS field-effect transistors of the n-channel type, the positive supply terminal is connected to the terminal A and the negative terminal of the d-c voltage source to the terminal B. The supply voltage $V_{CC}$ present between the terminals A and B need then be no higher than for example, 5 V.

The substrate terminal 1 is connected directly to the supply terminal B of the semiconductor chip H and is identical therewith, respectively. As can be seen from FIG. 4, the substrate terminal 1 is not only connected to the one end of the transistor R, but also carries the reference potential for the operational amplifier O, the second supply potential $V_{CC}$ of which is supplied via the internal supply input 3 of the integrated circuit ES proper.

As is evident from the circuit shown in FIG. 4, regulation of the reference potential $V_{SS}$ present at the internal supply input 2 of the integrated circuit ES proper is provided.

The substrate-bias generating circuit part SE, which is provided by the combination of the operational amplifier O and the resistor R, can be realized in a particularly simple manner, as evident from FIG. 5, by only a single MOS field-effect transistor T of the enhancement type or also of the depletion type, where the channel type of this transistor T is the channel type of the other field-effect transistor of the integrated semiconductor circuit which, for the time being, is assumed to be identical. If, therefore, the circuit is composed of n-channel field-effect transistors, then also the transistor T is a field-effect transistor of the n-channel type.

In all cases, the souce-drain path of the field-effect transistor T is then connected between the terminal B of the semiconductor body H carrying the potential i.e. especially the substrate terminal 1, and the internal terminal 2 of the semiconductor circuit ES proper, having the reference potential $V_{SS}$. In addition, the drain terminal of the transistor T is connected directly to the gate of this transistor T and, therefore, likewise to the to-be-generated reference potential $V_{SS}$ of the semiconductor circuit ES proper. The resistor R is realized in the circuit seen in FIG. 5 implicitly by the source-drain path of the transistor T, as is also the sought-after control behavior i.e. the essential action of the operational amplifier O according to the embodiment of FIG. 4 is realized by the embodiment seen in FIG. 5 without further circuit measures.

The essential advantage of the embodiment of the substrate bias generator shown in FIG. 5 is seen in that a reference potential Re is not required and thus, contrary to the embodiment according to FIG. 4, an additional connection between the supply terminals A and B of the semiconductor chip H and the circuit part SE supplying the regulated substrate bias i.e. the reference potential $V_{CC}$ of the circuit ES proper, is obviated.

Figure 6:
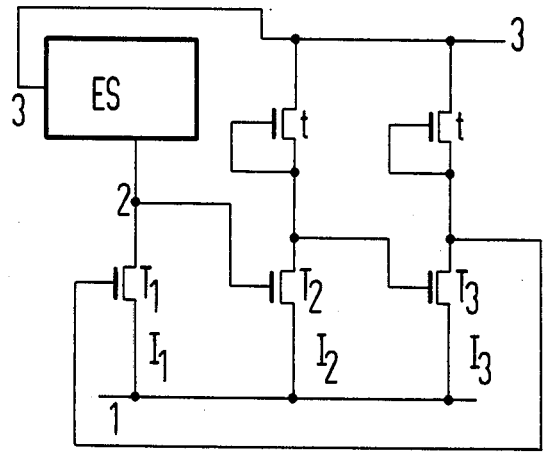
FIG. 6 is a circuit diagram of a more elaborate embodiment of the invention.

The same applies to an embodiment of the circuit part SE supplying the substrate bias as shown in FIG. 6 wherein an amplifier cascade formed of several transistors is provided instead of a single transistor T. In the embodiment shown in FIG. 6 this cascade is made up of three inverters, the output of the last inverter being fed back to the input of the first inverter so as to secure the negative feedback required for the delivery of a regulated reference potential $V_{SS}$ at the internal supply input 2 of the circuit ES proper.

It should be noted that in the circuit shown in FIG. 6 again, contrary to the embodiment of FIG. 5, a connection between the two terminals A and B of the semiconductor chip H, which is not via the semiconductor circuit ES proper, is provided additionally, because each of the following inverter stages of the amplifier cascade is supplied directly by the supply potentials present at the two supply terminals A and B.

The first amplifier cascade in the embodiment visualized from FIG. 6 represented by a driver transistor $T_1$ in series with a load resistance formed by all the current paths in the semiconductor circuit proper ES, via which the drain of the transistor $T_1$ is connected to the supply terminal 3 of the circuit ES proper, and thus to the supply terminal A. The source terminal of the driver transistor $T_1$ of the first inverter stage $I_1$ is connected to the terminal 1 of the substrate and therefore, to the supply terminal B.

The remaining amplifier cascades (in FIG. 6, two further amplifier cascades $I_2$ and $I_3$ are provided) are formed of a driver transistor $T_2$, $T_3$ and so forth, respectively, which is connected in series with a respective transistor t connected as a resistor, such as a depletion transistor, for example, where the source terminal of the driver transistor is connected directly to the terminal 1, and the drain terminal of the driver transistor is connected directly to the source terminal of the respective transistor connected as the load resistance t, as well as to the gate thereof. The drain terminals of the load resistance t of the second and the following inverter stages $I_2$, $I_3$ and so forth are all connected together with the internal terminal 3 for the other supply potential $V_{CC}$ of the integrated semiconductor circuit ES proper to the terminal A of the semiconductor chip H, which furnishes this supply potential.

The outputs of the individual inverter stages $I_1$, $I_2$, $I_3$ and so forth are represented by the drain terminals of their driver transistors $T_1$, $T_2$, $T_3$ and so forth while the signal inputs thereof are provided by the gate electrodes of the driver transistors thereof. To form the amplifier cascade, the output of the first inverter stage $I_1$ is connected to the input of the second inverter stage; the output of the second inverter stage $I_2$ to the input of the third inverter stage $I_3$, and so forth. The output of the inverter stage forming the last cascade (the inverter stage $I_3$, in the embodiment according to FIG. 6) is connected to the input of the first inverter stage i.e. of the first cascade stage (i.e. to the gate of the transistor $T_1$).

As compared to a circuit according to FIG. 5, the greater control sensitivity can be listed as an advantage and the higher circuitry expense as a disadvantage. The transistors $T_1$, $T_2$, $T_3$, t are of the same type as that of the other transistors of the circuit. If the circuit ES consists of integrated semiconductor circuits which contain, besides field-effect transistors, also bipolar transistors, the embodiments described with reference to FIGS. 4 to 6 for the additional circuit part SE serving for generating the substrate bias and, therefore, the reference potential $V_{SS}$ of the integrated semiconductor circuit proper, can be taken over directly. If the circuit is, respectively, a TTL-controlled integrated circuit ES and an integrated circuit ES which controls a TTL-circuit part, then the circuit part SE must be supplemented additionally to the manner shown in FIGS. 4 to 6, namely in the manner shown in FIG. 7.

Essential for this supplementation are field-effect MOS matching transistors T*1 and T*2 of the enhancement type and of the same channel type as the other transistors of the integrated semiconductor circuit, the doping of which is so adjusted by ion implantation that the cutoff voltage thereof is matched to the TTL input controlling the MOS circuit part and to the MOS circuit part controlled by the MOS circuit part, respectively. The additional circuit part SA which must be provided for response to TTL signal control can be seen in the left-hand half of FIG. 7 and the additional circuit part SB which must be provided for addressing a TTL circuit part is seen in the right-hand half of FIG. 7.

The TTL circuit part may be provided externally to the semiconductor chip containing the semiconductor circuit, for example, in the form of a second IC building block. However, it may also be combined monolithically with the semiconductor circuit including the circuit part SE. If the TTL circuit part serves for controlling the MOS circuit part ES, the latter has a TTL input TE which is controlled by the signals delivered by the TTL circuit part. If the MOS circuit part serves for controlling the TTL circuit part, then the MOS circuit part has a TTL output TA which can then be connected to the control input of the TTL circuit part to be controlled.

The input TE of the MOS circuit ES forming a part of the integrated semiconductor circuit proper, the input TE being controllable by a TTL circuit part is connected via the first matching transistor T*1 to the input of the MOS circuit ES represented by the MOS transistor $t_2$. To this end, the matching transistor T*1 is connected by the gate thereof to the TTL input TE (and also to the output of the controlling TTL circuit part), while the source terminal thereof is connected to the substrate terminal 1 and, therefore, also to the supply terminal B. The drain of the first matching transistor T* is connected, on the one hand, via a load represented, for example, by a transistor $t_1$, to the other supply terminal A and, in addition, to the gate of the input transistor $t_2$ which forms the signal input of the MOS semiconductor circuit ES. The reference potential $V_{SS}$ for the MOS semiconductor circuit ES proper i.e. also the source potential for the input transistor $t_2$, is delivered by the output 2 of the substrate bias generator SE.

In the case wherein the MOS part of the semiconductor circuit proper is provided for controlling an internal or external TTL circuit part, the circuit part SB, which is also shown in FIG. 7 is used. Therein, the output AU of the MOS circuit part ES, which is formed, for example, by the series connection of the source-drain paths of two field-effect transistors $t_3$, $t_4$ and by a circuit point between those two transistors, is connected to the gate of the matching transistor T*2, the drain of which forms the TTL output TA which can be connected to the input of a TTL circuit part and is connected via a load, represented, for example, by a further transistor $t_5$, to the supply terminal A supplying the supply potential $V_{CC}$ for the MOS circuit ES, while the source terminal thereof is connected directly to the terminal 1 and, thereby, to the terminal B for the voltage supply of the entire circuit. The connection of the MOS circuit part belonging to the reference potential $V_{SS}$ for the integrated semiconductor circuit ES proper corresponds to the connection according to FIGS. 4, 5 and 6.

The technological realization of the embodiment of a semiconductor circuit according to the invention shown in FIG. 5 can, in the simplest case, be in accordance with FIG. 8. On the front side of the semiconductor chip H, which is, for example, n-doped, the n-channel transistor T and several n-channel transistors tr belonging to the integrated circuit ES proper are provided, among othere things. In FIG. 8, two of these transistors tr are shown which, for example, together form an inverter stage and which are operated with the required supply voltage, on the one hand, from the output of the circuit part SE furnishing the reference voltage $V_{SS}$ and, on the other hand, by the internal supply terminal 3 to which the potential $V_{CC}$ can be applied.

It should be noted that in all these embodiments of the invention, a supply voltage $V_{SS}$ of 5 V is sufficient for the supply terminals AB if the transistors are realized in n-channel technology. If the transistors are formed of p-channel field-effect transistors, a supply voltage $V_{CC}$ of, for example, −5 V is required, for which the terminal B is to be connected to the positive terminal of the d-c voltage source supplying the supply voltage $V_{CC}$, and the terminal A to the negative terminal thereof.

There is claimed:

1. Monolithically integrated semiconductor circuit having elements formed on the front side of a monocrystalline semiconductor chip, the semiconductor chip having a first and a second electric terminal addressable by a respective supply potential, the first terminal carrying the supply potential for the integrated circuit, and the second terminal carrying a substrate bias supply potential applied to a substrate region bordering on the rear side of the semiconductor chip, both of the supply potentials being delivered by a d-c power source, the semiconductor circuit proper having an input addressable by a reference potential, comprising a voltage divider bridging both of the supply terminals and exclusively providing the reference potential, said voltage divider having a first part connected to the first terminal delivering the supply potential for the integrated circuit, said first part being the semiconductor circuit proper to which the reference voltage is applicable, and a second part connected to the second terminal delivering the substrate bias supply potential and generating the reference potential as well as the substrate bias supply potential, said second part having means for delivering to the semiconductor circuit proper said reference potential at a constant value and independently of the respective operating state of the semiconductor circuit proper, the semiconductor circuit proper being directly connected to an output of said second part and including a source of another reference potential, and wherein said semiconductor circuit proper has an internal terminal for applying a supply potential differing from said reference potential, said internal terminal being directly connected to said first terminal of the semiconductor chip, said second part including a substrate bias generator having a substrate terminal identical with a further supply terminal for carrying said other reference potential, said further supply terminal identical with said substrate terminal being directly connected to said second supply terminal of the semiconductor chip and wherein said substrate bias generator comprises an operational amplifier with negative feedback having an output and a non-inverting and an inverting input, said output of said operational amplifier being directly connected to said inverting input thereof as well as to an internal supply input carrying said first-mentioned reference potential for the semiconductor circuit proper, said internal supply input being connected via a resistance to said substrate terminal simultaneously carrying said other reference potential for said substrate bias generator.

2. Integrated semiconductor circuit according to claim 1 wherein said inverting input of said operational amplifier is connected to a null potential derivable from the supply potential present at said supply terminals of the semiconductor chip by means of a voltage divider connected across said last-mentioned supply terminals.

3. Integrated semiconductor circuit according to claim 1 wherein said substrate bias generator and said semiconductor circuit proper comprise MOS field-effect transistors of the same channel type.

4. Integrated semiconductor circuit according to claim 3 wherein said channel type is an n-channel type.

5. Monolithically integrated semiconductor circuit having elements formed on the front side of a monocrystalline semiconductor chip, the semiconductor chip having a first and a second electric terminal addressable by a respective supply potential, the first terminal carrying the supply potential for the integrated circuit, and the second terminal carrying a substrate bias supply potential applied to a substrate region bordering on the rear side of the semiconductor chip, both of the supply potentials being delivered by a d-c power source, the semiconductor circuit proper having an input addressable by a reference potential, comprising a voltage divider bridging both of the supply terminals and exclusively providing the reference potential, said voltage divider having a first part connected to the first terminal delivering the supply potential for the integrated circuit, said first part being the semiconductor circuit proper to which the reference voltage is applicable, and a second part connected to the second terminal delivering the substrate bias supply potential and generating the reference potential as well as the substrate bias supply potential, said second part having means for delivering to the semiconductor circuit proper said reference potential at a constant value and independently of the respective operating state of the semiconductor circuit proper, the semiconductor circuit proper being directly connected to an output of said second part; further including a source of another reference potential, and wherein said semiconductor circuit proper has an internal terminal for applying a supply potential differing from said reference potential, said internal terminal being directly connected to said first terminal of the semiconductor chip, said second part including a substrate bias generator having a substrate terminal identical with a further supply terminal for carrying said other reference potential, said further supply terminal identical with said substrate terminal being directly connected to said second supply terminal of the semiconductor chip; and wherein said substrate bias generator comprises an amplifier formed of a plurality of cascaded inverters, and including a series circuit between said two supply terminals of the semiconductor chip, said series circuit being formed by said series connection of said substrate bias generator and the semiconductor circuit proper and being bridged by each of the cascaded inverters following the first of said cascaded inverters, said substrate bias generator comprising a field-effect transistor, and the semiconductor circuit proper comprising field-effect transistors, all of said field-effect transistors being of one channel type, said series connection being of said field-effect transistor of said substrate bias generator and current supply paths of the semiconductor circuit proper, each of said following cascaded inverters comprising an MOS driver transistor and a load transistor connected as a diode, said driver transistor having a source terminal connected to said substrate terminal and a drain connected to said one of the two supply terminals of the semiconductor chip simultaneously connected directly to the semiconductor circuit proper, said driver transistors having gates, the gates of the driver transistors of the following cascaded inverters being connected to the respective drain of the driver transistor of the respective preceding cascaded inverter, and the gate of the driver transistor of the first cascaded inverter being connected to the drain of the driver transistor of the last cascaded inverter, said driver transistors and said load transistors being of the same channel type as that of the field-effect transistors of the semiconductor circuit proper; and wherein the semiconductor circuit proper comprises MOS transistors and is controlled via a control input by a circuit part, said control input being connected to the gate of an input driver transistor, said input driver transistor having a source terminal connected to said substrate terminal and a drain terminal connected via the source-drain path of a load transistor to said first one of the two supply terminals of the semiconductor chip connected to the semiconductor circuit proper, said drain terminal being further connected to the gate of a transistor forming the input of the semiconductor circuit proper and, in turn, connected by the source terminal thereof to the output of said substrate bias generator.

6. Monolithically integrated semiconductor circuit having elements formed on the front side of a monocrystalline semiconductor chip, the semiconductor chip having a first and a second electric terminal addressable by a respective supply potential, the first terminal carrying the supply potential for the integrated circuit, and a second terminal carrying a substrate bias supply potential applied to a substrate region bordering on the rear side of the semiconductor chip, both of the supply potentials being delivered by a d-c power source, the semiconductor circuit proper having an input addressable by a reference potential, comprising a voltage divider bridging both of the supply terminals and exclusively providing the reference potential, said voltage divider having a first part connected to the first terminal delivering the supply potential for the integrated circuit, said first part being the semiconductor circuit proper to which the reference voltage is applicable, and a second part connected to the second terminal delivering the substrate bias supply potential and generating the reference potential as well as the substrate bias supply potential, said second part having means for delivering to the semiconductor circuit proper said reference potential at a constant value and independently of the respective operating state of the semiconductor circuit proper, the semiconductor circuit proper being directly connected to an output of said second part; further including a source of another reference potential, and wherein said semiconductor circuit proper has an internal terminal for applying a supply potential differing from said reference potential, said internal terminal being directly connected to said first terminal of the semiconductor chip, said second part including a substrate bias generator having a substrate terminal identical with a further supply terminal for carrying said other reference potential, said further supply terminal identical with said substrate terminal being directly connected to said second supply terminal of the semiconductor chip; and wherein said substrate bias generator comprises an amplifier formed of a plurality of cascaded inverters, and including a series circuit between said two supply terminals of the semiconductor chip, said series circuit being formed by said series connection of said substrate bias generator and the semiconductor circuit proper and being bridged by each of the cascaded inverters following the first of said cascaded inverters, said substrate bias generator comprising a field-effect transistor, and the semiconductor circuit proper comprising field-effect transistors, all of said field-effect transistors being of one channel type, said series connection being of said field-effect transistor of said substrate bias generator and current supply paths of the semiconductor circuit proper, each of said following cascaded inverters comprising an MOS driver transistor and a load transistor connected as a diode, said driver transistor having a source terminal connected to said substrate terminal and a drain connected to said one of the two supply terminals of the semiconductor chip simultaneously connected directly to the semiconductor circuit proper, said driver transistors having gates, the gates of the driver transistors of the following cascaded inverters being connected to the respective drain of the driver transistor of the respective preceding cascaded inverter being connected to the drain of the driver transistor of the first cascaded inverter being connected to the drive of the driver transistor of the last cascaded inverter, said driver transistors and said load transistors being of the same channel type as that of the field-effect transistors of the semiconductor circuit proper; and wherein the semiconductor circuit proper controls, via a control output, a circuit part formed in accordance with TTL technology, the semiconductor circuit proper having a signal output connected for controlling an MOS inverter connected between said substrate terminal and said first one of the two supply terminals of the semiconductor chip connected to the semiconductor circuit proper, said MOS inverter having an output forming said TTL control output, said MOS inverter also having a driver transistor matched to the TTL conditions.

* * * * *